United States Patent
Falster et al.

(10) Patent No.: US 9,142,616 B2
(45) Date of Patent: Sep. 22, 2015

(54) SILICON WAFERS WITH SUPPRESSED MINORITY CARRIER LIFETIME DEGRADATION

(71) Applicant: SunEdison Inc., Maryland Heights, MO (US)

(72) Inventors: Robert J. Falster, London (GB); Vladimir Voronkov, Merano (IT)

(73) Assignee: SunEdison, Inc., Maryland Heights, MO (US)

( * ) Notice: Subject to any disclaimer, the term of this patent is extended or adjusted under 35 U.S.C. 154(b) by 0 days.

(21) Appl. No.: 14/596,269

(22) Filed: Jan. 14, 2015

(65) Prior Publication Data

US 2015/0123248 A1    May 7, 2015

Related U.S. Application Data

(62) Division of application No. 13/486,463, filed on Jun. 1, 2011, now Pat. No. 8,969,119.

(60) Provisional application No. 61/493,119, filed on Jun. 3, 2011.

(51) Int. Cl.
| | | |
|---|---|---|
| *H01L 21/324* | (2006.01) | |
| *H01L 29/16* | (2006.01) | |
| *H01L 21/322* | (2006.01) | |

(52) U.S. Cl.
CPC ............ *H01L 29/16* (2013.01); *H01L 21/3221* (2013.01)

(58) Field of Classification Search
CPC .................................................. H01L 21/0201
USPC .......................................................... 148/33
See application file for complete search history.

(56) References Cited

U.S. PATENT DOCUMENTS

2010/0243036 A1    9/2010    Herguth et al.

FOREIGN PATENT DOCUMENTS

WO    2011032272 A1    3/2011

OTHER PUBLICATIONS

International Search Report and Written Opinion, Application No. PCT/US2012/040492, dated Oct. 12, 2012, pp. 13.
Mukannan Arivanandhan, et al., Effects of B and Ge codoping on minority carrier lifetime in Ga-doped Czochralski-silicon, Journal of Applied Physics, dated 2009, pp. 013721-1-013721-5, vol. 106.
Jan Schmidt, et al., Light-Induced Degradation in CZ Silicon Solar Cells: Fundamental Understanding and Strategies for its Avoidance, 12th Workshop on Crystalline Silicon Solar Cell Materials and Processes, dated 2002, pp. 8.
Bianca Lim, et al., Permanent Deactivation of the Boron-Oxygen Recombination Center in Silicon Solar Cells, 23rd European Photovoltaic Solar Energy Conference, dated 2008, pp. 1018-1022.
S.W. Glunz, et al, Degradation of Carrier Lifetime in Cz Silicon Solar Cells, Solar Energy Materials & solar Cells, Elsevier, dated 2001, pp. 219-229, vol. 65.
Ji Youn Lee, Rapid Thermal Processing of Silicon Cells—Passivation and Diffusion, dated 2003, pp. 173.
S.W. Glunz, et al, On the Degradation of Cz-Silicon Solar Cells, Crystalline Silicon Solar Cells and Technologies, 1998, pp. 1343-1346, 2nd World Conference and Exhibition on Photovoltaic Solar Energy Conversion.
Ji Youn Lee, et al., Improvement of Charge Minority-Carrier Lifetime in p(Boron)-Type Czochralski Silicon by Rapid Thermal Annealing, Progress in Photovoltaics: Research and application, John Wiley & Sons, Ltd., dated 2001, pp. 417-424, vol. 9.
Jan Schmidt, et al., Formation and Annihilation of the Metastable Defect in Boron-Doped Czochralski Silicon, IEEE, dated 2002, pp. 178-181.
Bianca Lim, et al., Impact of Dopant Compensation on the Deactivation of Boron-Oxygen Recombination Centers in Crystalline Silicon, Applied Physics Letters, dated 2009, pp. 232109-1-232109-3, vol. 95.
Bianca Lim, et al., Deactivation of the Boron-Oxygen Recombination Center in Silicon by Illumination at Elevated Temperature, Physica Status Solidi, www.pss-rapid.com, InterScience, Wiley-VCH Verlag GmbH & Co., dated 2008, pp. 93-95, vol. 3.
Karsten Bothe, Oxygen-Related Trapping and Recombination Centres in Boron-Doped Crystalline Silicon, Von der Fakultät für Mathematick und Physik der Universität Hannover, dated 2006, pp. 161.
Karsten Bothe, Electronically Activated Boron-Oxygen-Related Recombination Centers in Crystalline Silicon, Journal of Applied Physics, dated 2006, pp. 013701-1- 013701-11, vol. 99.
Karsten Bothe, et al., Fundamental Boron-Oxygen-Related Carrier Lifetime Limit in Mono-and Multicrystalline Silicon, Progress in Photovoltaics: Research and Applications, Wiley InterScience, dated 2005, pp. 287-296, vol. 13.
Bianca Lim, et al., Lifetime Recovery in p-Type Czochralski Silicon Due to the Reconfiguration of Boron-Oxygen Complexes Via a Hole-Emitting Process, Applied Physics letters, dated 2011, pp. 162104-1-162104-3, vol. 98.
V.V. Voronkov et al., Latent Complexes of Interstitial Boron and Oxygen Dimers as a Reason for Degradation of Silicon-Based Solar Cells, Journal of Applied Physics, dated 2010, pp. 053509-1-053509-8, vol. 107.

*Primary Examiner* — George Fourson, III
(74) *Attorney, Agent, or Firm* — Armstrong Teasdale LLP

(57) ABSTRACT

Processes for suppressing minority carrier lifetime degradation in silicon wafers are disclosed. The processes involve quench cooling the wafers to increase the density of nano-precipitates in the silicon wafers and the rate at which interstitial atoms are consumed by the nano-precipitates.

20 Claims, No Drawings

SILICON WAFERS WITH SUPPRESSED MINORITY CARRIER LIFETIME DEGRADATION

CROSS-REFERENCE TO RELATED APPLICATIONS

This application is a divisional of U.S. patent application Ser. No. 13/486,463, filed Jun. 1, 2012, which claims the benefit of U.S. Provisional Application No. 61/493,119, filed Jun. 3, 2011, both of which are incorporated herein by reference.

BACKGROUND

The field of this disclosure relates to processes for suppressing minority carrier lifetime degradation in silicon wafers for use. In particular, the field of the disclosure relates to efficient and cost effective processes for reducing the concentration of minority carrier lifetime degradation defects itself.

Solar cells and, particularly, cells manufactured on boron containing p-type single crystal silicon wafers grown by the Czochralski method and also, typically to a lesser extent, multicrystalline wafers grown by casting degrade in performance when exposed to light or when minority carriers are injected into the cell in the dark. This performance degradation continues until a stable efficiency well below the initial efficiency is achieved. The efficiency loss in CZ wafer-based cells may be up to about 10% or more. Such loss of efficiency in Czochralski solar cells limits the potential for high efficiency silicon cells and the use of single crystal silicon in the industry since Czochralski cells are typically more expensive to produce than multicrystalline silicon-based cells.

It has been found that this degradation may be at least temporarily reversed by annealing the wafer for a few minutes at a low temperature such as an anneal at about 200° C.; however, the increase in efficiency achieved by the low temperature anneal is lost upon subsequent illumination. It has been reported that the degradation may be permanently reversed by injecting excess electrons into the wafer (e.g., by illuminating the wafer) during a low temperature anneal in the range between 50° C. and about 230° C.); however, for permanent recovery to occur under these conditions the low temperature anneal must occur for relatively long periods of time (e.g., several tens of hours).

A continuing need exists for commercially practical methods for permanently suppressing the degradation defect that is related to light induced degradation in solar cells.

SUMMARY

One aspect of the present disclosure is directed to a process for suppressing minority carrier lifetime degradation related to a degradation defect in a silicon wafer. The wafer comprises boron in a concentration of at least about $10^{13}$ atoms/cm$^3$. The degradation defect is composed of a fast-diffusing component and a dimeric oxygen-containing component. The silicon wafer is heated to a temperature $T_1$ which is sufficient to dissolve pre-existing nano-precipitates of the fast-diffusing component of the degradation defect. The silicon wafer is cooled from $T_1$ to a temperature $T_2$ at a cooling rate $R_1$. The silicon wafer is cooled from $T_2$ to a temperature $T_3$ at a cooling rate $R_2$. The ratio of $R_1$ to $R_2$ is at least about 2:1.

Another aspect of the present disclosure is directed to a process to suppress minority carrier lifetime degradation related to a degradation defect in a silicon wafer. The wafer comprises boron in a concentration of at least about $10^{13}$ atoms/cm$^3$. The degradation defect is composed of a fast-diffusing component and a dimeric oxygen-containing component. The silicon wafer is heated to a temperature $T_1$ which is sufficient to nucleate nano-precipitates of the fast-diffusing component of the degradation defect. The silicon wafer is cooled from $T_1$ to a temperature $T_2$ at a cooling rate $R_1$ of at least about 100° C./sec.

A further aspect the present disclosure is directed to a silicon wafer. Boron is present in the wafer in a concentration of at least about $10^{13}$ atoms/cm$^3$. The minority carrier lifetime degradation of the wafer related to a degradation defect comprising a fast-diffusing component and a dimeric oxygen-containing component is suppressed by heating the silicon wafer to a temperature $T_1$ which is sufficient to nucleate nano-precipitates of the fast-diffusing component of the degradation defect. The silicon wafer is cooled from $T_1$ to a temperature $T_2$ at a cooling rate $R_1$. The silicon wafer is cooled from $T_2$ to a temperature $T_3$ at a cooling rate $R_2$ while illuminating the wafer, the ratio of $R_1$ to $R_2$ being at least about 2:1.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

DETAILED DESCRIPTION

Without being bound to a particular theory, it is believed that degradation of minority carrier lifetime in a boron and oxygen containing wafer is related to the presence of a minority carrier lifetime degradation defect ("MCLD", also referred to herein as "degradation defect"). This minority carrier lifetime degradation defect is believed to be composed of two components—a fast diffusing component ("FDC") such as interstitial boron, interstitial copper or interstitial nickel and a dimeric oxygen-containing component ("DOCC") such as a dimer of oxygen ($O_2$) or a complex of substitutional boron and the dimer ($B_sO_2$). The degradation defect may be composed of interstitial boron and the oxygen dimer ($B_iO_2$); however, it should be noted that the degradation defect may be any combination of the fast-acting components ($B_i$, $Cu_i$ or $Ni_i$) and oxygen-containing components ($O_2$ or $B_sO_2$). It should be noted that it is believed that boron forms part of the underlying mechanism that causes minority carrier lifetime degradation and that boron forms part of the defect either as the fast-acting component or the oxygen-containing component. In this regard, the present application should not be limited to a particular degradation defect. As used herein, "fast-diffusing component" or "oxygen-containing component" refers to the respective components that form the minority carrier lifetime degradation defect that causes loss of minority carrier lifetime.

In a silicon wafer cooled to room temperature, the population of the fast diffusing component (FDC) is believed to be generally distributed between being bound up in nano-precipitates (NPPT) and/or being bound to the dimeric oxygen containing component (DOCC). The bound combination of the fast diffusing component and the dimeric oxygen containing component forms the minority carrier lifetime degrading defect (MCLD) as stated above. The portion of the population bound into NPPT is not believed to contribute to the minority carrier lifetime degradation since it is not believed to be part of the population of MCLD. In accordance with embodiments of the present disclosure, the MCLD defect may be efficiently and cost effectively dissolved by rapidly transferring FDC from the population of MCLD defects to the population of nanoprecipitates NPPT and thereby reducing or eliminating the population of MCLD from the system.

At steady state there is the following general reaction $$\mathrm{MCLD} \leftrightarrows \mathrm{FDC} + \mathrm{DOCC} \qquad (1).$$

The reaction constant may be constant such that at modest temperatures (say around 200° C. without generating minority charge carriers) there is very little FDC in the system (very few bonds are broken). The concentration of MCLD is basically unchanged.

By introducing minority charge carriers into the system, the charge state of MCLD and the backward reaction in reaction (1) may be blocked such that the FDC cannot react with DOCC to form the MCLD. In this manner only the forward reaction wherein the MCLD dissolves to form FDC and DOCC; FDC which is liberated thermally cannot now recombine with DOCC to reform MCLD:

$$\mathrm{MCLD} \rightarrow \mathrm{FDC} + \mathrm{DOCC} \qquad (2).$$

To reduce the concentration of MCLD in accordance with embodiments of the present disclosure, FDC is removed from the system to prevent later recombination with DOCC and formation of MCLD. This may be achieved by promoting combination of FDC with nanoprecipitates to which they may bind freely due to the fast-diffusing nature of FDC according to the following reaction:

$$\mathrm{FDC} \rightarrow \mathrm{NPPT} \qquad (3).$$

Under excess minority charge carrier conditions, the thermally liberated FDC—which are now substantially inhibited from re-binding with DOCC—diffuse through the system until they contact a NPPT to which it is bound.

Accordingly, the concentration of FDC may be lowered. The result of this reduction is the production of more FDC from MCLD sources via reaction (2)—which then also diffuse around until they too are trapped by NPPT again reducing the concentration of FDC resulting in again more liberated FDC from MCLD sources. This may occur until all of the FDC are pumped away from the MCLD to the NPPT thus substantially reducing or even substantially eliminating the population of the minority carrier lifetime degradation defects.

In accordance with embodiments of the present disclosure, the rate at which reaction (3) occurs may be increased by creating a substantially higher product of number density (N) and radius (R) than is typically present, NR. This at least partially sets the time constant for the sinking of FDC to NPPT. The time constant of the sinking rate of FDC to NPPT is believed to set the time constant for the rate at which MCLD is dissolved away.

Without being bound to any particular theory, it has been found that the NR product may be set by the cooling rate through the temperature at which the NPPT form after having been dissolved at higher temperatures. In accordance with embodiments of the present disclosure, this may be controlled by using a relatively large cooling rate through this temperature such that the time constant for the sinking and MCLD dissolution is very small. As a result, a subsequent or concurrent minority charge carrier-injecting dissolution process may occur relatively rapidly (e.g., into a solar cell manufacturing process).

In accordance with the methods of the present disclosure, a boron-containing silicon wafer is annealed to dissolve pre-existing nano-precipitates of the fast-diffusing component of the degradation defect. The wafer is then rapidly cooled through a temperature range at which the nucleation of nano-precipitates of these fast-diffusing components occurs to form a new distribution of nano-precipitates, with a substantially higher product of number density (N) and radius (R) than is typically present, NR. This new distribution of nano-precipitates is the basis for a more effective permanent recovery in the sample. An increased NR product for the nano-precipitates results in a more rapid reduction in the concentration of the degradation defect during a sojourn in the permanent recovery temperature range under conditions of excess electrons (e.g., under illumination). The installed distribution of nano-precipitates of the fast-diffusing components of the degradation defect consumes a substantial portion of the residual fast-diffusing components taking them away from the degradation defect thereby reducing the concentration of the degradation defect, inducing permanent recovery of the minority carrier lifetime. That is, once the nano-precipitates of the fast-diffusing components of the degradation defect are formed in the wafer, the wafer is subjected to a permanent deactivation process (e.g., low-temperature anneal while generating minority charge carriers) to prevent the formation of lifetime degrading defects, by depleting the wafer of interstitial fast-diffusing components using the high number density of nano-precipitates as a sink for the fast-diffusing components.

In this regard, it has been found that a permanent loss of degradation may involve not only a transformation of the degradation defect from the active to the latent state but also an elimination or reduction in the actual density of the latent state. The lower the concentration of the degradation defect the fewer active degradation defects may be generated. It is believed that permanent recovery occurs because introduction of minority charge carriers results in pumping of fast-diffusing components from the degradation defect to the distribution of grown-in nano-precipitates in the wafer.

In this regard, it has been found that the rate constant at which fast-diffusing components of the degradation center may be consumed by nano-precipitates of these fast-diffusing components during a permanent deactivation treatment is independent of the initial concentration of fast-diffusing components which form the complex and, more specifically, independent of interstitial fast-diffusing component atoms, and rather depends on the rate at which the wafer is cooled from an annealing temperature, $T_1$, through the temperature range at which the nano-precipitates of the fast-diffusing component of the degradation center form. Specifically, it has been found that the sink rate is proportional to the product of the precipitate density (N) and precipitate radius (R) and that N and R are proportional to the initial concentration of interstitial fast-diffusing component atoms ($C_i$) and the cooling rate (q) as follows:

$$N \sim q^{3/2}/C_i^{1/2} \qquad (1),$$

$$R \sim C_i^{1/2}/q^{1/2} \qquad (2).$$

Accordingly, the sink rate of the interstitial fast-diffusing components during a permanent deactivation treatment (and with it the rate at which the density of latent defects) is primarily proportional to the cooling rate as shown below:

$$\text{Sink rate} \sim NR \sim (q^{3/2} * C_i^{1/2})/(C_i^{1/2} * q^{1/2}) \sim q \qquad (3).$$

Thus sink rate is directly proportional to the cooling rate. Thus by rapidly cooling the p-type boron containing semiconductor wafer through the temperature of nano-precipitate nucleation, the product NR may be proportionally increased thereby increasing the rate at which interstitial fast-diffusing atoms are consumed during a permanent deactivation treatment, thus more rapidly reducing the concentration of the degradation center and thus more rapidly permanently suppressing the degradation of the minority carrier lifetime.

In one or more embodiments of the present disclosure for permanently restoring the minority carrier lifetime and efficiency of solar cells, a boron-containing silicon wafer is thermally annealed to a temperature $T_1$ sufficient to dissolve pre-existing nano-precipitates of the fast-diffusing component of the degradation center and above the nucleation temperature of the nano-precipitates in a first step $S_1$. In this regard, it should be understood that while the silicon wafer that is subjected to the methods for suppressing minority carrier lifetime degradation of the present disclosure may be referred to herein as a single crystal silicon wafer (i.e., a slice of an ingot grown by the Czochralski method), multicrystalline silicon wafers may also be used. Additionally, the process steps described above may be applied to an epitaxial silicon layer or even to float zone (FZ) (if oxygen doped) single crystal silicon wafers without limitation. Further, the boron-containing wafer that is subjected to a degradation suppression process of an embodiment of the present disclosure may be a wafer that has been incorporated into a manufactured solar cell (i.e., a cell with a p-n junction formed therein), photovoltaic module or a wafer structure produced according to one or more intermediate steps in solar cell manufacture. Alternatively, the boron-containing wafer may be a stand alone wafer that has yet to be subjected to solar cell manufacturing processes.

In this regard, while the wafer may be described as being a p-type wafer which is conventionally used in solar cell applications, in some particular embodiments, the wafer may contain a number density of p-type dopants less than the density of p-type dopants in wafers that are generally classified as "p-type" in the art (e.g., a number density less than typical for $p^-$ wafers). Regardless of the overall p-type doping concentration, the wafer subjected to the process of embodiments of the present disclosure contains at least about $10^{13}$ boron atoms/cm$^3$. In other embodiments, the wafer contains at least about $10^{14}$ boron atoms/cm$^3$, at least about $10^{15}$ boron atoms/cm$^3$, at least about $10^{16}$ boron atoms/cm$^3$ or even at least about $10^{17}$ boron atoms/cm$^3$ (e.g., from about $10^{13}$ boron atoms/cm$^3$ to about $10^{18}$ boron atoms/cm$^3$, from about $10^{13}$ boron atoms/cm$^3$ to about $10^{17}$ boron atoms/cm$^3$, from about $10^{14}$ boron atoms/cm$^3$ to about $10^{17}$ boron atoms/cm$^3$ or from about $10^{15}$ boron atoms/cm$^3$ to about $10^{18}$ boron atoms/cm$^3$). In addition to boron, the wafer may contain other p-type dopants such as aluminum and gallium. The total p-type doping amount may be such that the wafer is classified as a $p^-$, p, $p^+$, $p^{++}$-type wafer or may have a concentration less than $p^-$ doped wafers as discussed above. The concentration of oxygen in the wafer may be within a range typical for Czochralski-grown silicon such as a concentration between about $5\times10^{17}$ atoms/cm$^3$ and about $9\times10^{17}$ atoms/cm$^3$ or even from about $5\times10^{16}$ atoms/cm$^3$ to about $3\times10^{18}$ atoms/cm$^3$. It should be understood that the boron, p-type dopant and oxygen concentrations recited above are exemplary and other concentrations may be used without departing from the scope of the present disclosure. In some embodiments, the wafer may be counter-doped with one or more n-type dopants (e.g., phosphorus, arsenic, antimony or combinations thereof), with the relative concentrations of p-type dopants and n-type dopants being such that the wafer may be characterized as a p-type wafer as discussed above.

The silicon wafer may have a diameter of about 150 mm, about 200 mm, about 300 mm, about 450 mm or more. The starting wafer may be polished, etched and/or lapped or these operations may be performed after a method for permanent suppression of minority carrier lifetime degradation according to the present disclosure is applied. It should be further noted that embodiments of the present disclosure may included any solar cell or wafer, upon which solar cells may be manufactured, regardless of their shape and/or size including, for example, multicrystalline cast wafers and "pseudo-square" CZ wafers.

The heat treatment $S_1$ involves heating the wafer to a temperature $T_1$ sufficient to dissolve pre-existing nano-precipitates of the fast-diffusing components of the degradation defect as well as the degradation defect itself and annealing at that temperature for a relatively short period of time. It is believed that the pre-existing nano-precipitates of the fast-diffusing components of the degradation center dissolve at temperatures of at least about 650° C. and may dissolve at temperatures as low as about 600° C., as low as about 550° C. or even as low as 500° C. Accordingly, $T_1$ may be at least about 500° C., at least about 600° C., at least about 650° C., at least about 700° C., or from about 500° C. to about 1300° C., from about 500° C. to about 1150° C., from about 500° C. to about 1000° C., from about 500° C. to about 850° C., from about 500° C. to about 750° C. or from about 600° C. to about 750° C. The wafer will generally be maintained at or above this temperature $T_1$ for at least about 1 second, typically for at least several seconds (e.g., at least about 3 seconds, at least about 5 seconds, etc.) or even several tens of seconds (e.g., at least about 20 seconds, at least about 30 seconds, at least about 40 seconds, etc.) and even for up to about 60 seconds.

Preferably, the thermal anneal $S_1$ forms part of an existing process step such as solar cell manufacturing process steps that involve heating of the p-type wafer. Alternatively or in addition, the thermal annealing step $S_1$ may be carried out in, for example, any of a number of commercially available furnaces (e.g., belt furnace) or in rapid thermal annealing ("RTA") furnaces in which wafers are individually heated by banks of high power lamps. The wafer may be heated in step $S_1$ from an intermediate temperature which forms part of a conventional processing step or from room temperature. In some embodiments the wafer is heated to a temperature sufficient to dissolve nano-precipitates of the fast-diffusing components without maintaining the temperature at an intermediate temperature (e.g., continual temperature increase until the desired temperature is reached). The wafers may be annealed in a number of different ambients or atmospheres, including those typical with solar cell manufacturing including, for example, ambients containing hydrogen or gases inert with respect to silicon (e.g., noble gases such as argon). Processing steps $S_2$ and $S_3$ described below may be performed in similar ambients.

Upon completion of the thermal annealing step, $S_1$, the wafer, in step $S_2$, is rapidly cooled from $T_1$ to a second temperature $T_2$ at a cooling rate $R_1$ of at least about 100° C./sec with cooling rates of at least about 200° C./sec being preferred so as to cause the formation of a high number density of nano-precipitates of the fast-diffusing component, N, each having a nominal radius, R. In some embodiments, the cooling rate may be at least about 250° C./sec, at least about 500° C./sec, at least about 750° C./sec or even at least about 1000° C./sec. It should be understood that the wafer need not be cooled from $T_1$ to $T_2$ at a constant rate. The cooling rate R may be constant or vary during cooling so as to cause the formation of a high number density of nano-precipitates, N. Generally, the wafer may be cooled at a rate greater than the recited minimum with maximum cooling rates being those at which the integrity of the wafer may be compromised if exceeded (e.g., temperatures above which dislocations may form in the wafer). Generally, the wafer is cooled from $T_1$ to $T_2$ at a rate $R_1$ that is higher than conventional cooling rates that are typical in conventional processing (e.g., higher than cooling rates typical for rapid thermal annealing operations). That is, conventional rapid thermal annealers typically cool rapidly from high temperatures such as 1200° C. down to around 650° C. or even 600° C. due to the very high thermal gradients and additional cooling provided by photon release. However, to achieve such rapid cooling rates at temperatures below 600° C. (e.g., from 600° C. to about 300° C. or lower), additional cooling means may be applied.

Suitable apparatus for rapidly cooling the wafer in step $S_2$ generally comprise a heat sink to which heat is rapidly transferred from the wafer to the heat sink by conductive transfer of heat. Suitable apparatus may include a thermal plate that includes a surface that thermally contacts one or more surfaces of the wafer during cooling. In some embodiments, the thermal plate is cooled by contacting the plate with a refrigerant. In some embodiments, the wafer is partially or wholly submerged in a fluid to rapidly cool the wafer. Alternatively or in addition, the apparatus may utilize a cooling ambient that is at a temperature less than the wafer to rapidly cool the wafer.

The cooling step $S_2$ causes atoms of the fast-diffusing component of the degradation defect to become supersaturated in the wafer. By cooling at rates exceeding conventional processes, the number density (the product NR) of nano-precipitates may be increased relative to processes which involve slower cooling rates thereby substantially increasing the NR product number density of nano-precipitates of the fast-diffusing component.

Generally, $T_2$ is at least about 50° C. less than about $T_1$ or at least about 100° C., at least about 150° C., at least about 200° C., at least about 250° C. or even at least about 300° C. less than $T_1$. $T_2$ may be less than about 500° C., less than about 450° C., less than about 400° C., less than about 350° C., less than about 300° C. or even less than about 250° C. (e.g., from about 150° C. to about 450° C. or from about 250° C. to about 400° C.). Preferably, $T_2$ is as low as possible as the wafer is rapidly cooled between $T_1$ and $T_2$ which results in reduction of processing time; however, $T_2$ should be sufficiently high to allow the wafer to undergo a permanent suppression of efficiency loss in step $S_3$ described below.

In this regard, it should be understood that the thermal anneal step $S_1$ and rapid cooling step $S_2$ may be performed without generating minority charge carriers (i.e., without illuminating the wafer or applying a current to the wafer); however it should be understood that minority charge carriers may be generated during the thermal annealing step and/or cooling step without limitation. The thermal anneal step $S_1$ and rapid cooling step $S_2$ cause the atoms of the fast-diffusing component to form a distribution with a NR product greater than conventional methods which allows a relatively shorter permanent recovery process $S_3$ to be applied as explained below.

In a third step $S_3$ minority charge carriers are generated at temperatures of from about room temperature (about 25° C.) to about 250° C. (e.g., from about room temperature to about 200° C., from about room temperature to about 150° C., from about room temperature to about 100° C., from about 50° C. to about 250° C. or from about 50° C. to about 150° C.) to permanently suppress lifetime carrier degradation. In one embodiment, the minority charge carriers are generated while the wafer is cooled from $T_2$ to a temperature $T_3$ at a cooling rate $R_2$. In this regard, it has been found that the thermal annealing step $S_1$ and cooling step $S_2$ allow the permanent deactivation step $S_3$ to be performed for a shorter period of time relative to conventional permanent deactivation treatments (e.g., the deactivation methods disclosed in U.S. Pat. Pub. No. 2010/0243036 which is incorporated herein by reference for all relevant and consistent purposes).

Without being bound to any particular theory, it is believed that permanent recovery may result from minority carriers (e.g., electrons) blocking the normal path of interstitial fast-diffusing components to the degradation defect, thereby pumping these interstitial fast-diffused components to the nano-precipitates of the fast-diffusing species allowing the fast-diffusing component interstitials to be consumed by the nano-precipitates. Since it is believed that the degradation defect exists in equilibrium with the fast-diffusing component and the oxygen-containing component, the consumption of interstitial fast-diffusing components by the nano-precipitates results in a permanent depletion of the minority carrier degradation defect. By rapidly cooling the wafer from the anneal temperature $T_1$ of step $S_1$, the product of the precipitate density (N) and nano-precipitate radius (R) may be increased which increases the rate at which the interstitial fast-diffusing components are consumed by the nano-precipitates (e.g., interstitial fast-diffusing components are consumed rapidly due to the relatively large number of nano-precipitates of fast-diffusing components which act as sinks, consuming the interstitial fast-diffusing components). As a result, the permanent recovery process of the present disclosure may be performed for a shorter period of time relative to conventional processes without a corresponding loss in permanent suppression of lifetime carrier degradation, thereby increasing processing throughput. In this regard, it should be understood that "permanent recovery" as used herein refers to a suppression of minority carrier lifetime degradation which substantially lasts the ordinary lifetime of the resulting photovoltaic cell.

In several embodiments of the present disclosure $T_3$ is less than about 250° C. and, in other embodiments, is less than about 200° C., less than about 150° C., less than about 100° C., less than about 50° C. or from about 200° C. to about room temperature (e.g., about 25° C.), from about 150° C. to about 25° C., from about 100° C. to about 25° C. or from about 150° C. to about 50° C. The cooling rate $R_2$ between temperatures $T_2$ and $T_3$ should be sufficiently low to allow the wafer to achieve permanent suppression of lifetime carrier degradation. By performing the thermal anneal step $S_1$ and cooling step $S_2$, the cooling rate $R_2$ in step $S_3$ may generally be less than the cooling rates used in conventional methods for permanently suppressing lifetime carrier degradation in which a wafer is held at a temperature for a period of time (e.g., up to several hours) and cooled back to ambient (i.e., use cooling rates on the scale of several degree per minute). Exemplary cooling rates $R_2$ include cooling rates that allow minority carriers to be generated for a sufficient amount to suppress minority carrier degradation such as less than about 10° C./sec, less than about 5° C./sec, less than about 1° C./sec, less than about 0.5° C./sec or even less than about 0.1° C./sec. The cooling rate should be sufficiently high so as to not unnecessarily reduce throughput. Exemplary minimum cooling rates $R_2$ of at least about 0.01° C./sec, at least about 0.1° C./sec or even at least 0.5° C./sec may be used. In several embodiments the cooling rate $R_2$ ranges from about 0.01° C./sec to about 10° C./sec, from about 0.1° C./sec to about 10° C./sec, from about 0.5° C./sec to about 10° C./sec or from about 0.1° C./sec to about 5° C./sec.

In this regard, it should be understood that the wafer need not be cooled at a generally uniform rate between temperatures $T_2$ and $T_3$. For instance, the wafer may be held at $T_2$ or at any temperature between $T_2$ and $T_3$ for a period of time (e.g., from about 30 seconds to about 15 minutes) and then cooled (e.g., cooled to about ambient). Thus, $R_2$ (and $R_1$ discussed above) represent the time averaged cooling rate including the time at which the wafer is held at temperature $T_2$ and/or other temperatures between $T_2$ and $T_3$ (i.e., $R_2$ is $T_2$-$T_3$ divided by the time at which the wafer is cooled from $T_2$ to $T_3$).

In some particular embodiments of the present disclosure, the wafer may be subjected to further processing (i.e., device fabrication) after permanent suppression step $S_3$ which may require the wafer to be heated upon completion of $S_3$. In these embodiments, the wafer may be held at temperature $T_2$ for a period of time to complete the permanent suppression step $S_3$ and then heated above $T_2$ to complete the further thermal processing step. In such embodiments, $R_2$ is considered to be about 0 and $T_2$ is generally equal to $T_3$. In embodiments wherein further processing (i.e., device fabrication) is performed after permanent suppression step $S_3$, the further processing step(s) preferably does not heat the wafer to a temperature above about 650° C. or even above 600° C. as such heating may cause the precipitates to dissolve and for the permanent degradation suppression to be lost.

Generally the cooling rate $R_2$ is less than the cooling rate $R_1$ to allow the wafer to achieve permanent deactivation of the recombination centers during step $S_3$. For example, the ratio of $R_1$ to $R_2$ may be at least about 2:1. In other embodiments, the ratio of $R_1$ to $R_2$ is at least about 3:1, at least about 5:1, at least about 10:1, at least about 20:1, at least about 50:1 or from about 2:1 to about 200:1, from about 2:1 to about 150:1, from about 10:1 to about 150:1 or from about 20:1 to about 150:1.

Minority charge carriers may be generated during step $S_3$ by directing any light that is capable of generating electrons in silicon at the wafer. For light at wavelengths shorter than about 1.1 μm, the wafer may be illuminated at an intensity of at least about 50 mW/cm$^2$ and, in other embodiments, at least about 100 mW/cm$^2$ or even about 200 mW/cm$^2$. It should be noted that light at wavelengths longer than about 1.1 μm may also be used; however in some embodiments the light should be applied at a higher power or for a longer period of time relative to shorter wavelength light (e.g., at least about 500 mW/cm$^2$ or even at least about 1,000 mW/cm$^2$). In one or more embodiments, illumination is provided via heating lamps located within a belt furnace or of a rapid thermal annealing apparatus. It may be preferred to illuminate all surfaces of the wafer to influx minority charge carriers; however in one or more embodiments of the present disclosure only the front surface of the wafer is illuminated.

Alternatively or in addition to illumination, minority charge carriers may be generated during step $S_3$ by applying a current to the wafer. Generally, such a current may be applied by forming an n-type layer (e.g., by implantation, diffusion or deposition of a discrete layer such as an epi-layer) on or within the wafer with a pn junction formed between the p-layer and n-layer. Current is applied to the pn junction to provide minority carriers to the region of the wafer doped with p-type dopants. The voltage applied to the wafer may be at least about 0.4 volts or even at least about 0.7 volts. The current may be applied to the p-type wafer by applying the current to a fabricated photovoltaic cell or even to fabricated photovoltaic modules. It should be understood that minority carriers need not be generated during the entire time at which the wafer is cooled from $T_2$ to $T_3$.

In one or more particular embodiments of the present disclosure, $T_1$ is at least about 600° C., $T_2$ is less than about 250° C., $R_1$ is at least about 100° C./sec, $T_3$ is about ambient temperature (e.g., about 25° C.) and $R_2$ is less than about 5° C./sec.

The effect of the present degradation suppression process may be determined by any of the methods known by those of skill in the art. An exemplary method includes (1) measuring the efficiency of a solar cell containing a boron-containing wafer by exposing the cell to light for a small period of time (e.g., for a time period less than about 1 millisecond or even less than about 200 microseconds), (2) exposing the cell to light for a longer period (e.g., at least one hour, more typically several hours or days or even for one or more months) in an attempt to degrade performance, and (3) measuring efficiency after exposure to light in step 2. If the efficiency loss is negligible or small (e.g., less than about 10% efficiency loss or, as in other embodiments, less than about 5%, less than about 1% or less than about 0.5% efficiency loss), permanent suppression of degradation has been achieved.

When introducing elements of the present disclosure or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above apparatus and methods without departing from the scope of the disclosure, it is intended that all matter contained in the above description and shown in the accompanying figures shall be interpreted as illustrative and not in a limiting sense.

What is claimed is:

1. A silicon wafer comprising boron, boron being present in the wafer in a concentration of at least about $10^{13}$ atoms/cm$^3$, the minority carrier lifetime degradation of the wafer related to a degradation defect comprising a fast-diffusing component and a dimeric oxygen-containing component being suppressed by:
   heating the silicon wafer to a temperature $T_1$ which is sufficient to nucleate nano-precipitates of the fast-diffusing component of the degradation defect;
   cooling the silicon wafer from $T_1$ to a temperature $T_2$ at a cooling rate $R_1$ of at least about 100° C./sec; and
   cooling the silicon wafer from $T_2$ to a temperature $T_3$ at a cooling rate $R_2$ while illuminating the wafer, the ratio of $R_1$ to $R_2$ being at least about 2:1.

2. A silicon wafer as set forth in claim 1 wherein the ratio of $R_1$ to $R_2$ is at least about 10:1.

3. A silicon wafer as set forth in claim 1 wherein the ratio of $R_1$ to $R_2$ is at least about 20:1.

4. A silicon wafer as set forth in claim 1 wherein the ratio of $R_1$ to $R_2$ is at least about 50:1.

5. A silicon wafer as set forth in claim 1 wherein the pre-existing nano-precipitates dissolved in the heating step are composed of boron, copper, nickel or combinations thereof.

6. A silicon wafer as set forth in claim 1 wherein the pre-existing nano-precipitates dissolved in the heating step are composed of boron.

7. A silicon wafer as set forth in claim 1 wherein minority charge carriers are generated while the wafer is cooled from $T_2$ to $T_3$.

8. A silicon wafer as set forth in claim 7 wherein minority charge carriers are generated by illuminating the wafer while the wafer is cooled from $T_2$ to $T_3$.

9. A silicon wafer as set forth in claim 7 wherein minority charge carriers are generated by applying a current to the wafer while the wafer is cooled from $T_2$ to $T_3$.

10. A silicon wafer as set forth in claim 1 wherein $R_1$ is at least about 250° C./sec.

11. A silicon wafer as set forth in claim 1 wherein $R_1$ is at least about 500° C./sec.

12. A silicon wafer as set forth in claim 1 wherein $T_1$ is at least about 500° C.

13. A silicon wafer as set forth in claim 1 wherein $T_2$ is less than about 500° C.

14. A silicon wafer as set forth in claim 1 wherein $T_3$ is less than about 150° C.

15. A silicon wafer as set forth in claim 1 wherein $R_2$ is less than about 10° C./sec.

16. A silicon wafer as set forth in claim 1 wherein the wafer comprises a second p-type dopant, the second p-type dopant being selected from the group consisting of Al, Ga and combinations thereof.

17. A silicon wafer as set forth in claim 1 wherein the silicon wafer is a slice of an ingot grow by the Czochralski process.

18. A silicon wafer as set forth in claim 1 wherein the silicon wafer forms part of a solar cell.

19. A silicon wafer as set forth in claim 1 wherein the silicon wafer is a stand-alone wafer.

20. A silicon wafer as set forth in claim 1 wherein $T_1$ is at least about 600° C., $T_2$ is less than about 250° C., $R_1$ is at least about 100° C./sec, $T_3$ is about 25° C. and $R_2$ is less than about 5° C./sec.

\* \* \* \* \*

UNITED STATES PATENT AND TRADEMARK OFFICE
CERTIFICATE OF CORRECTION

PATENT NO. : 9,142,616 B2  
APPLICATION NO. : 14/596269  
DATED : September 22, 2015  
INVENTOR(S) : Falster et al.

Page 1 of 1

It is certified that error appears in the above-identified patent and that said Letters Patent is hereby corrected as shown below:

On the Title Page, in item (62), in Related U.S. Application Data, delete "Jun. 1, 2011" and insert therefor -- Jun. 1, 2012 --.

Signed and Sealed this  
Twenty-first Day of June, 2016

Michelle K. Lee  
*Director of the United States Patent and Trademark Office*